(12) United States Patent
Iwasaki et al.

(10) Patent No.: US 12,500,097 B2
(45) Date of Patent: Dec. 16, 2025

(54) WAFER STORAGE CONTAINER CLEANING APPARATUS, AND WAFER STORAGE CONTAINER CLEANING METHOD (71) Applicant: SUMCO CORPORATION, Tokyo (JP)

(72) Inventors: Fumitoshi Iwasaki, Tokyo (JP); Katsuro Wakasugi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 216 days.

(21) Appl. No.: 18/277,432

(22) PCT Filed: Nov. 9, 2021

(86) PCT No.: PCT/JP2021/041151
§ 371 (c)(1),
(2) Date: Aug. 16, 2023

(87) PCT Pub. No.: WO2022/176284
PCT Pub. Date: Aug. 25, 2022

(65) Prior Publication Data
US 2024/0128095 A1    Apr. 18, 2024

(30) Foreign Application Priority Data

Feb. 18, 2021 (JP) ................................. 2021-024296

(51) Int. Cl.
B08B 9/08 (2006.01)
H01L 21/67 (2006.01)

(52) U.S. Cl.
CPC .. H01L 21/67051 (2013.01); H01L 21/67057 (2013.01)

(58) Field of Classification Search
CPC ......... B08B 3/006; B08B 3/044; B08B 3/045; B08B 3/047; B08B 3/048; B08B 3/08;
(Continued)

(56) References Cited

U.S. PATENT DOCUMENTS

2016/0303622 A1* 10/2016 Rebstock ................. B08B 3/08

FOREIGN PATENT DOCUMENTS

CN    105706226 B    1/2019
JP    2001-000929 A   1/2001
(Continued)

OTHER PUBLICATIONS

Machine Translation of Adachi et al., JP 2004-167337, Jun. 2004. (Year: 2004).*

(Continued)

Primary Examiner — David G Cormier
(74) Attorney, Agent, or Firm — Greenblum & Bernstein, P.L.C.

(57) ABSTRACT

A wafer container cleaner includes a cleaning bath capable of accommodating a housing jig that houses a wafer container including a container body and a cover, liquid-supply nozzles for supplying cleaning liquid or the like into the cleaning bath, and a liquid-discharge nozzle for discharging to-be-discharged fluid out of the cleaning bath. The container body has a depth wall at a side opposite a container opening. In an accommodating state where the container body mounted on the storage fixture with the container opening facing downward is accommodated in the cleaning bath, the liquid-supply nozzles are provided so that respective liquid-supply openings through which the cleaning liquid or the like is discharged face an inner side of the depth wall and the liquid-discharge nozzle is provided so that a discharge opening through which the to-be-discharged fluid is sucked in faces a center of the inner side of the depth wall.

4 Claims, 10 Drawing Sheets (58) Field of Classification Search
CPC .. B08B 3/10; B08B 3/108; B08B 9/08; B08B 9/0804; B08B 9/0813; B08B 9/0821; B08B 9/0826; B08B 9/0848; B08B 9/0861; B08B 2209/08; H01L 21/6735
See application file for complete search history.

(56) References Cited

FOREIGN PATENT DOCUMENTS

| | | |
|---|---|---|
| JP | 2004-167337 A | 6/2004 |
| JP | 2020-72215 A | 5/2020 |

OTHER PUBLICATIONS

International Preliminary Report on Patentability Issued in Corresponding International Patent Application No. PCT/JP2021/041151, dated Aug. 22, 2023, along with an English translation thereof.
International Search Report issued in International Bureau of WIPO Patent Application No. PCT/JP2021/041151, dated Jan. 18, 2022, along with an English translation thereof.
Office Action issued in Taiwan Counterpart Patent Appl. No. 110156430, dated Jun. 29, 2022, along with an English translation thereof.
International Preliminary Report on Patentability issued in International Bureau of WIPO Patent Application No. PCT/JP2021/041151, dated Jan. 18, 2022.

* cited by examiner

WAFER STORAGE CONTAINER CLEANING APPARATUS, AND WAFER STORAGE CONTAINER CLEANING METHOD

TECHNICAL FIELD

The present invention relates to a wafer container cleaner for cleaning a wafer container including a container body for storing a plurality of wafers and a cover for closing a container opening of the container body and a cleaning method of the wafer container.

BACKGROUND ART

Typical cleaning methods of a wafer container are a shower method and an immersion method. The shower method uses cleaning liquid or cleaning water (e.g. pure water), which is directly sprayed onto a wafer container to clean the wafer container. In the immersion method, a wafer container is immersed in a first cleaning bath filled with cleaning liquid and then is immersed in a second cleaning bath filled with cleaning water to remove the cleaning liquid.

Patent Literature 1 discloses a cleaning method of a wafer container, which includes: a local cleaning step of locally cleaning a part of a container body of the wafer container in contact with a packing using a high-pressure jet or the like; and an overall cleaning step of cleaning the entirety of the wafer container by the shower method or the immersion method.

CITATION LIST

Patent Literature(s)

Patent Literature 1 JP 2020-72215 A

SUMMARY OF THE INVENTION

Problem(s) to be Solved by the Invention

Figure 9:
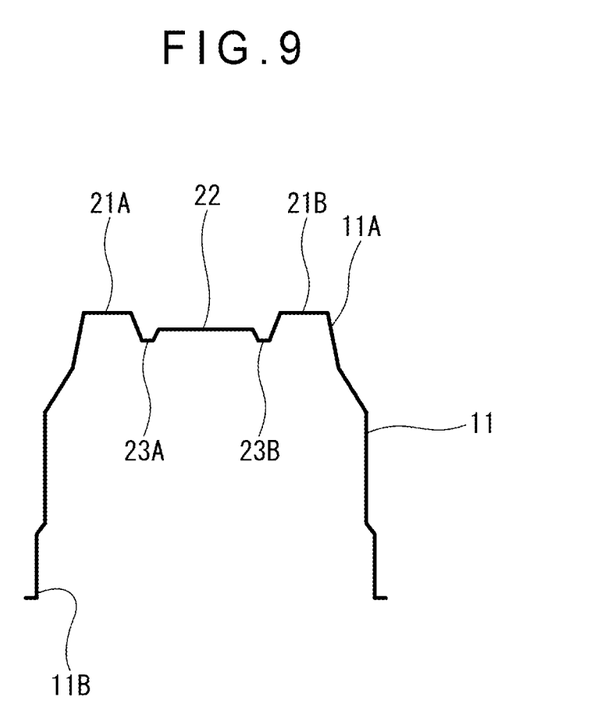
FIG. 9 is a schematic front elevational cross-sectional view depicting an example of an arrangement of a container body of the wafer container with a container opening facing downward.

As depicted in FIG. 9, a container body 11 of a typical wafer container is provided with, for instance, a depth wall 11A at a side opposite a container opening 11B. At an inner side of the depth wall 11A, a central cavity 22 is provided at the center of the depth wall 11A and peripheral cavities 21A and 21B are provided around the central cavity 22. Further, convex portions 23A and 23B are provided between the peripheral cavities 21A and 21B and the central cavity 22.

When the container body 11 is immersed in the cleaning liquid or the like in the cleaning bath of the wafer container cleaner with the container opening 11B facing downward, air is sometimes left at the peripheral cavities 21A and 21B and the central cavity 22. In this case, the cleaning liquid or the like does not reach the peripheral cavities 21A and 21B and the central cavity 22, failing to sufficiently clean the wafer container.

Further, a cover 12 of the wafer container is provided with a pair of latch mechanisms 24 (see FIG. 10A) for fixing and locking the cover 12 with the container body 11 and a front retainer 25 (see FIG. 10B) for pressing and fixing a wafer onto an inner side of the container body 11. When the cover 12 is to be cleaned by the shower method or the immersion method, the cleaning liquid or the like sometimes does not reach minute parts and hollows of the latch mechanisms 24, the front retainer 25 and the like, thereby failing to sufficiently clean the wafer container.

In addition, according to the immersion method, though the container body 11 is immersed in the cleaning water after immersing the container body 11 in the cleaning liquid, the cleaning liquid sometimes cannot be washed out by the cleaning water to be left in a form of residual cleaning liquid inside the container body 11. The residual liquid sometimes deteriorates the container body 11 with age or causes appearance defects (e.g. stain caused by water scale).

The related art disclosed in Patent Literature 1, which is not constructed in consideration of the above problems, fails to solve the above problems.

Thus, a wafer container cleaner and a cleaning method of the wafer container capable of improving cleaning performance for the wafer container have been desired.

An object of the invention is to provide a wafer container cleaner and a cleaning method of the wafer container capable of improving cleaning performance for the wafer container.

Means for Solving the Problem(s)

A wafer container cleaner according to an aspect of the invention is configured to clean a wafer container including a container body configured to store a plurality of wafers and a cover configured to close a container opening of the container body, the wafer container being housed in a housing jig that allows fluid circulation therethrough, the wafer container cleaner including: a cleaning bath configured to accommodate the housing jig housing the wafer container; a plurality of liquid-supply nozzles configured to supply cleaning liquid or cleaning water into the cleaning bath; and a liquid-discharge nozzle configured to discharge to-be-discharged fluid out of the cleaning bath, in which the container body includes a depth wall at a side opposite the container opening, at least one of the plurality of liquid-supply nozzles includes a liquid-supply opening through which the cleaning liquid or the cleaning water is discharged, the liquid-supply opening facing an inner side of the depth wall in an accommodating state where the container body mounted on the housing jig with the container opening facing downward is accommodated in the cleaning bath, and the liquid-discharge nozzle includes a discharge opening through which the to-be-discharged fluid is sucked in, the discharge opening facing a center of the inner side of the depth wall in the accommodating state.

In the wafer container cleaner according to the above aspect of the invention, a supply flow rate for supplying the cleaning liquid or the cleaning water into the container body is set larger than a discharge flow rate for discharging the cleaning liquid or the cleaning water from an inside of the container body through the liquid-discharge nozzle.

The wafer container cleaner according to the above aspect of the invention further includes an immersion-takeout movement mechanism configured to move the housing jig to an immersed state for the housing jig to be immersed in the cleaning liquid or the cleaning water in the cleaning bath and to a pulled-up state for the housing jig to be pulled up out of the cleaning liquid or the cleaning water from the immersed state.

A method for cleaning a wafer container according to another aspect of the invention is for cleaning a wafer container including a container body configured to store a plurality of wafers and a cover configured to close a container opening of the container body, the wafer container being housed in a housing jig that allows fluid circulation therethrough, the container body including a depth wall at a side opposite the container opening, the method including:

immersing the housing jig housing the wafer container with the container opening of the container body facing downward in the cleaning bath filled with cleaning liquid or cleaning water, in which in an immersed state of the wafer container, the cleaning liquid or the cleaning water is supplied toward an inner side of the depth wall and to-be-discharged fluid is discharged from a region near a center of the inner side of the depth wall.

In the method for cleaning the wafer container according to the above aspect of the invention, in the immersion step, a supply flow rate for supplying the cleaning liquid or the cleaning water into the container body is set larger than a discharge flow rate for discharging the cleaning liquid or the cleaning water out of the container body.

The method for cleaning the wafer container according to the above aspect of the invention further includes causing at least one reciprocating movement of the housing jig between an immersed state for the housing jig to be immersed in the cleaning liquid or the cleaning water in the cleaning bath and a pulled-up state for the housing jig to be pulled up out of the cleaning liquid or the cleaning water from the immersed state.

According to the above aspects of the invention, cleaning performance of the wafer container can be improved.

DESCRIPTION OF EMBODIMENT(S)

An exemplary embodiment of the invention will be described below with reference to the attached drawings.

Structure of Wafer Container Cleaner 1

Figure 1:
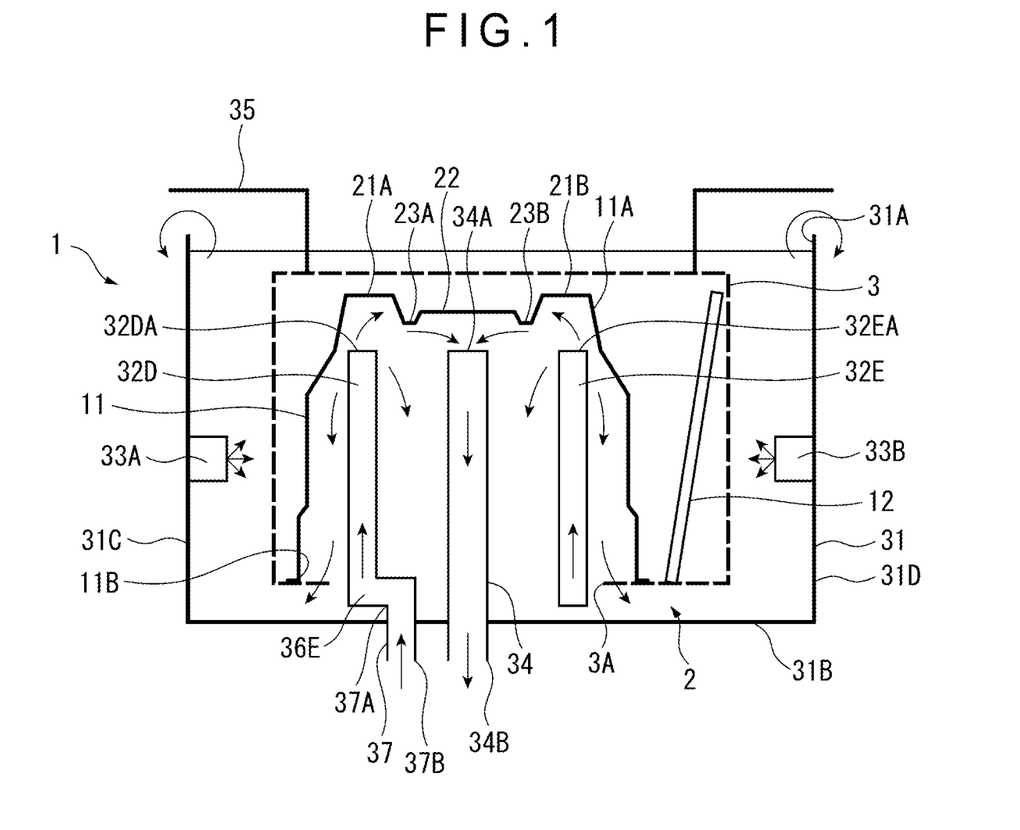
FIG. 1 is a schematic front elevational cross-sectional view depicting a cleaning process of a wafer container with a use of a wafer container cleaner according to an exemplary embodiment of the invention.
Figure 2:
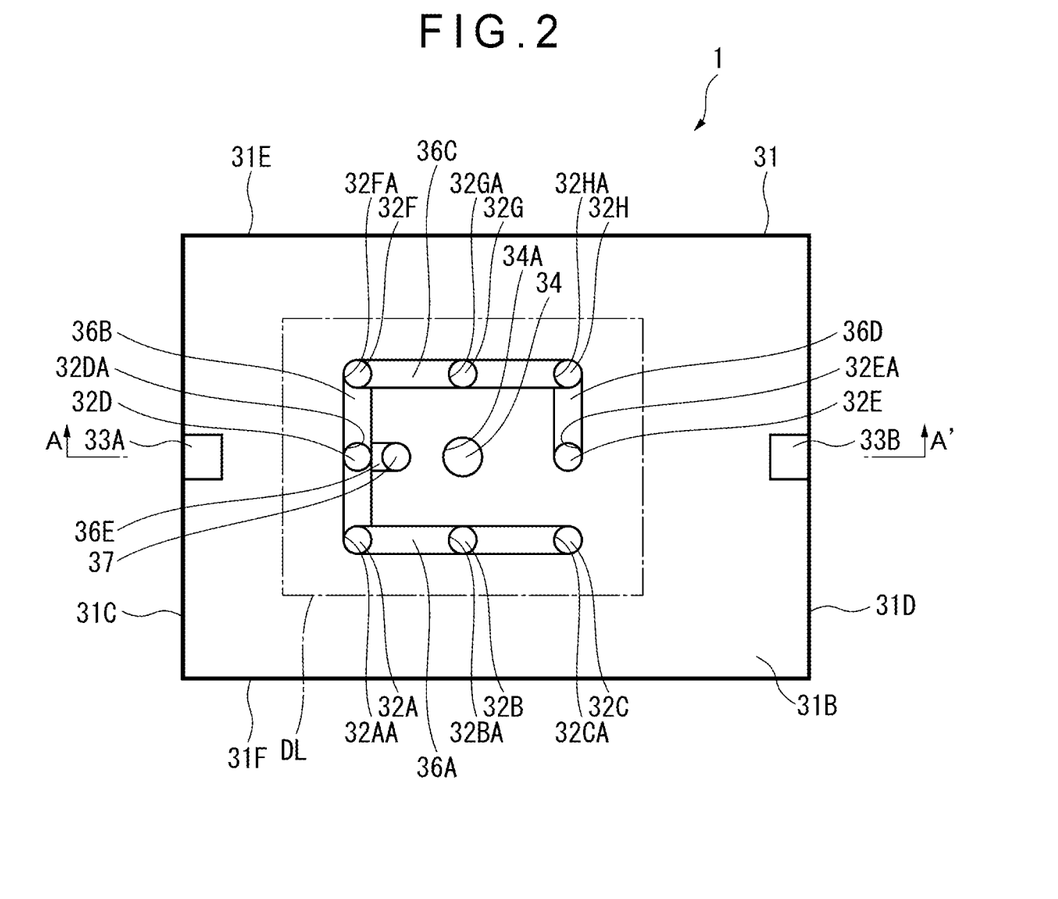
FIG. 2 is a schematic plan view depicting the wafer container cleaner depicted in FIG. 1.
Figure 3:
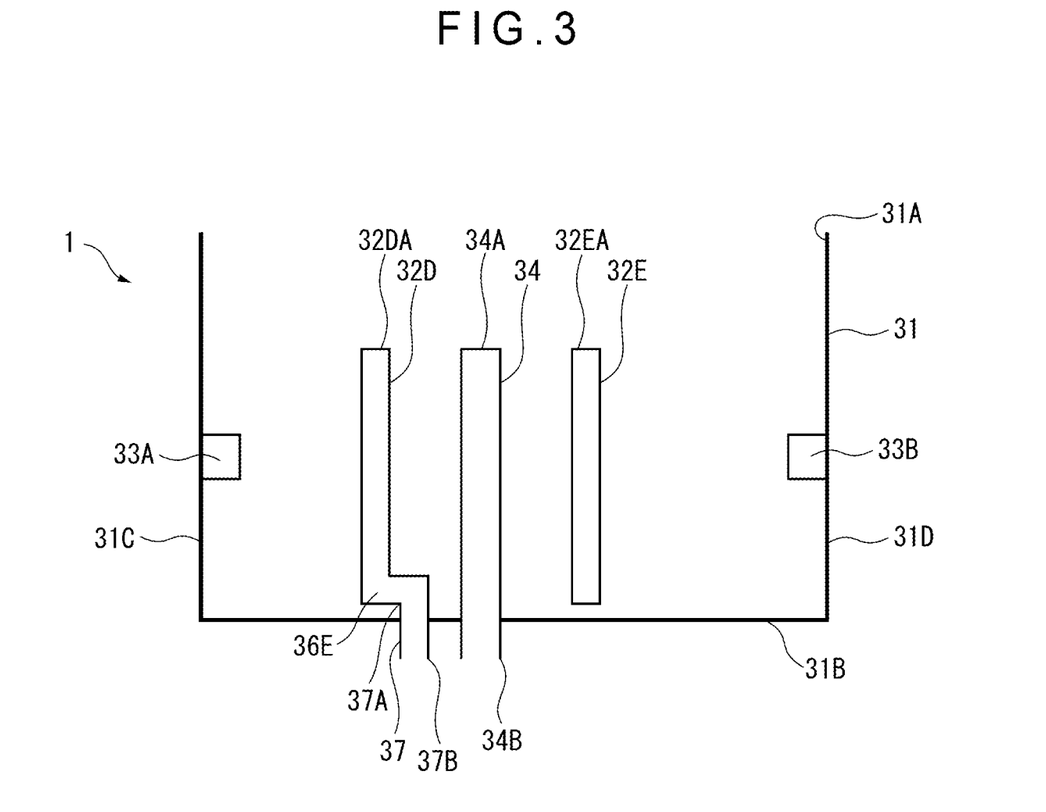
FIG. 3 is a cross-sectional view viewed as indicated by arrows A-A' in FIG. 2.

As depicted in FIGS. 1 to 3, a wafer container cleaner 1 is configured to clean a wafer container 2 including a container body 11 configured to store a plurality of wafers and a cover 12 configured to close a container opening 11B of the container body 11, the wafer container 2 being housed in a housing jig 3 that allows fluid circulation therethrough.

The wafer container cleaner 1 includes a cleaning bath 31, a plurality of liquid-supply nozzles 32 (eight liquid-supply nozzles 32A to 32H in the present exemplary embodiment), a plurality of side liquid-supply nozzles 33 (two side liquid-supply nozzles 33A and 33B in the present exemplary embodiment), a liquid-discharge nozzle 34, and an immersion-takeout movement mechanism 35.

The cleaning bath 31 is sized to be capable of accommodating the housing jig 3 housing the wafer container 2. The cleaning bath 31, which is in a form of a substantially rectangular box, has a bath opening 31A at an upper end thereof.

Figure 6:
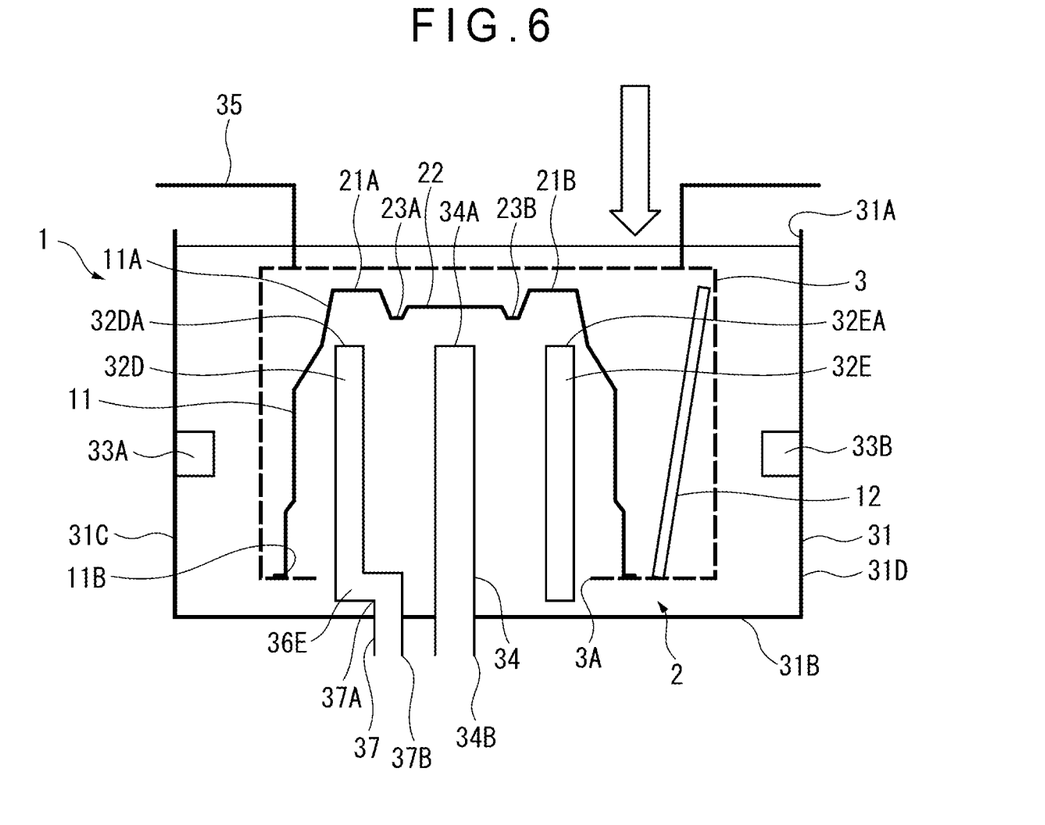
FIG. 6 is a schematic front elevational cross-sectional view depicting the housing jig housing the wafer container, which is immersed in cleaning liquid or the like in the wafer container cleaner.

In an accommodating state where the container body 11 (a frame drawn by a dash-dotted line DL in FIG. 2) mounted on the housing jig 3 with the container opening 11B facing downward is accommodated in the cleaning bath 31, each of the liquid-supply nozzles 32A to 32H is configured to discharge cleaning liquid or cleaning water (e.g. pure water) through respective liquid-supply openings 32AA to 32HA thereof toward the depth wall 11A of the container body 11 (see FIGS. 1 and 6).

As depicted in FIG. 2, the liquid-supply nozzles 32A to 32H, which are each connected in series by connector pipes 36A to 36D to define a C-shape, are connected with a liquid-supply pipe 37 through a connector pipe 36E.

The connector pipe 36A is connected to each of lower ends of the liquid-supply nozzles 32A to 32C and the connector pipe 36B. The connector pipe 36B is connected to each of lower ends of the liquid-supply nozzles 32A, 32D, and 32F and the connector pipes 36C and 36E. The connector pipe 36C is connected to each of lower ends of the liquid-supply nozzles 32F to 32H and the connector pipe 36D. The connector pipe 36D is connected to each of lower ends of the liquid-supply nozzles 32E and 32H.

As depicted in FIG. 1, an upper end 37A of the liquid-supply pipe 37 penetrates through a bath bottom 31B of the cleaning bath 31 to be connected with the connector pipe 36E in the cleaning bath 31. A lower end 37B of the liquid-supply pipe 37 is connected to a liquid-supply pump (not depicted).

In the accommodating state where the container body 11 mounted on the housing jig 3 with the container opening 11B facing downward is accommodated in the cleaning bath 31, the liquid-discharge nozzle 34 penetrates through the bath bottom 31B so that a discharge opening 34A, through which to-be-discharged fluid is sucked in, is located close to the center of the inner side of the depth wall 11A (see FIGS. 1 and 6). A lower end 34B of the liquid-discharge nozzle 34 is connected to a liquid-discharge pump (not depicted). It should be noted that the height of the liquid-discharge nozzle 34 is substantially equal to the height of each of the liquid-supply nozzles 32A to 32H in the present exemplary embodiment.

A distance between the depth wall 11A of the container body 11 and the liquid-supply openings 32AA to 32HA in the accommodating state is, though being different depending on the type of the container body 11 and the shape of the depth wall 11A, preferably 50 mm or less, for instance. With the above distance being 50 mm or less, the cleaning liquid reaches every part of the depth wall 11A to allow the interior of the container body 11 to be sufficiently cleaned. A fluid introduction unit (e.g. projection(s)), which is optionally provided at an end of the liquid-discharge nozzle 34, is optionally in contact with the depth wall 11A. In this arrangement, the to-be-discharged fluid and air can be vigorously sucked through a space, which is created between the depth wall 11A and the discharge opening 34A.

Side liquid-supply nozzles 33A and 33B are provided substantially at the center of an inner side of respective side walls 31C and 31D (right and left facing walls in FIG. 2) of the cleaning bath 31. In the same manner as the liquid-supply nozzles 32A to 32H, the side liquid-supply nozzles 33A and 33B are connected to a liquid-supply pump (not depicted). The side liquid-supply nozzles 33A and 33B are configured to discharge cleaning liquid or pure water toward the center of the cleaning bath 31 to clean an outer wall of the container body 11 and/or one side of the cover 12.

Figure 4:
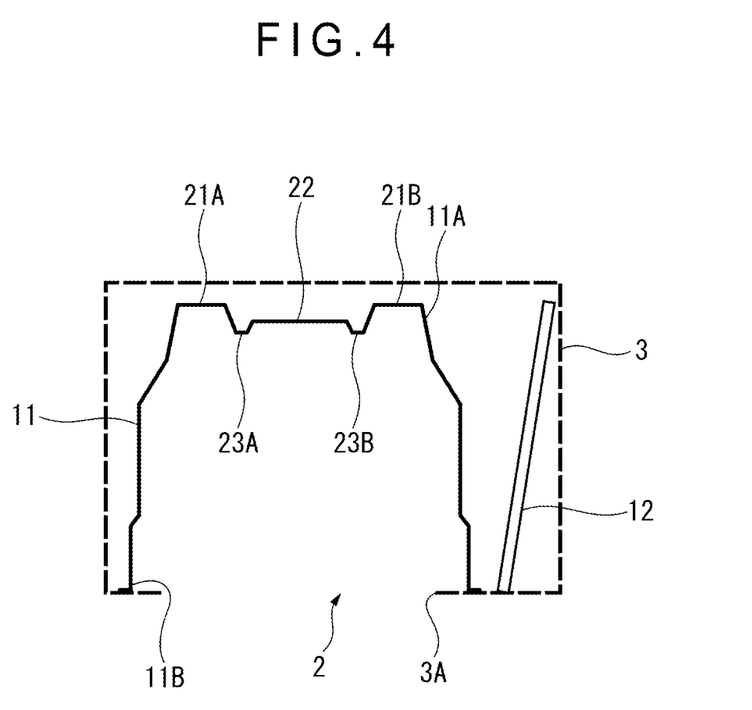
FIG. 4 is a schematic front elevational cross-sectional view depicting the wafer container housed in a housing jig to be used in the wafer container cleaner depicted in FIG. 1.
Figure 10A:
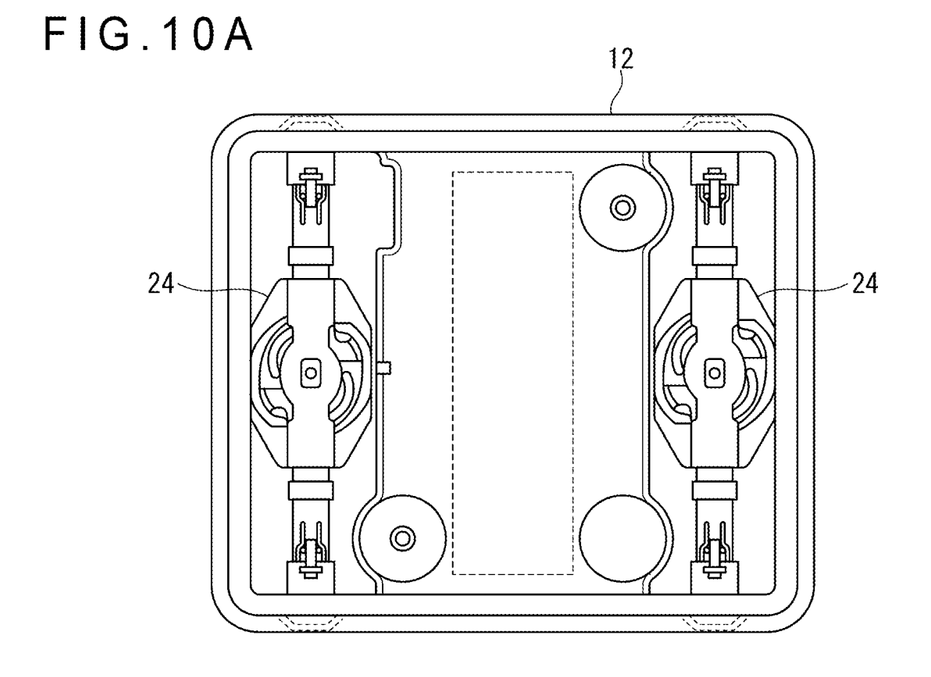
FIG. 10A is a plan view depicting an example of an arrangement of a cover of the wafer container.
Figure 10B:
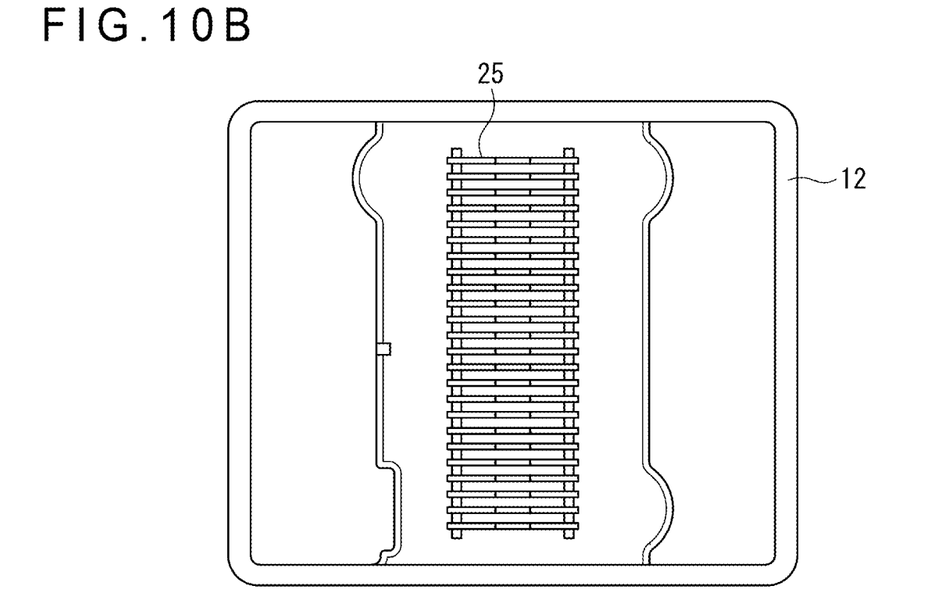
FIG. 10B is a plan view depicting an example of an arrangement of a back side of the cover of the wafer container.

Next, the housing jig 3 for housing the container body 11 and the cover 12 will be described with reference to FIG. 4. In FIG. 4, the housing jig 3 is depicted in broken lines and the latch mechanisms 24 and the front retainer 25 depicted in FIG. 10A are not depicted on the cover 12. It should be noted that FIGS. 1, 5, and 6 are depicted in a similar fashion.

The housing jig 3 is sized to be capable of housing the container body 11 and the cover 12. The housing jig 3, which is constructed by, for instance, assembling resin-made pipes into a rectangular parallelepiped whose sides are defined by coarse grids, allows fluid circulation therethrough. The components of the sides of the housing jig 3 constructed in a form of a rectangular parallelepiped are capable of being assembled and disassembled by loosening/fastening screws, nuts, and any other appropriate fasteners (not depicted) or by attaching/detaching joints (not depicted) for connecting the pipes. A lower opening 3A is formed at a lower end of the housing jig 3. The lower opening 3A and the container opening 11B are rectangles that are similar to each other, where the periphery of the lower opening 3A is supported by the periphery of the container opening 11B to house the container body 11 in the housing jig 3.

Figure 5:
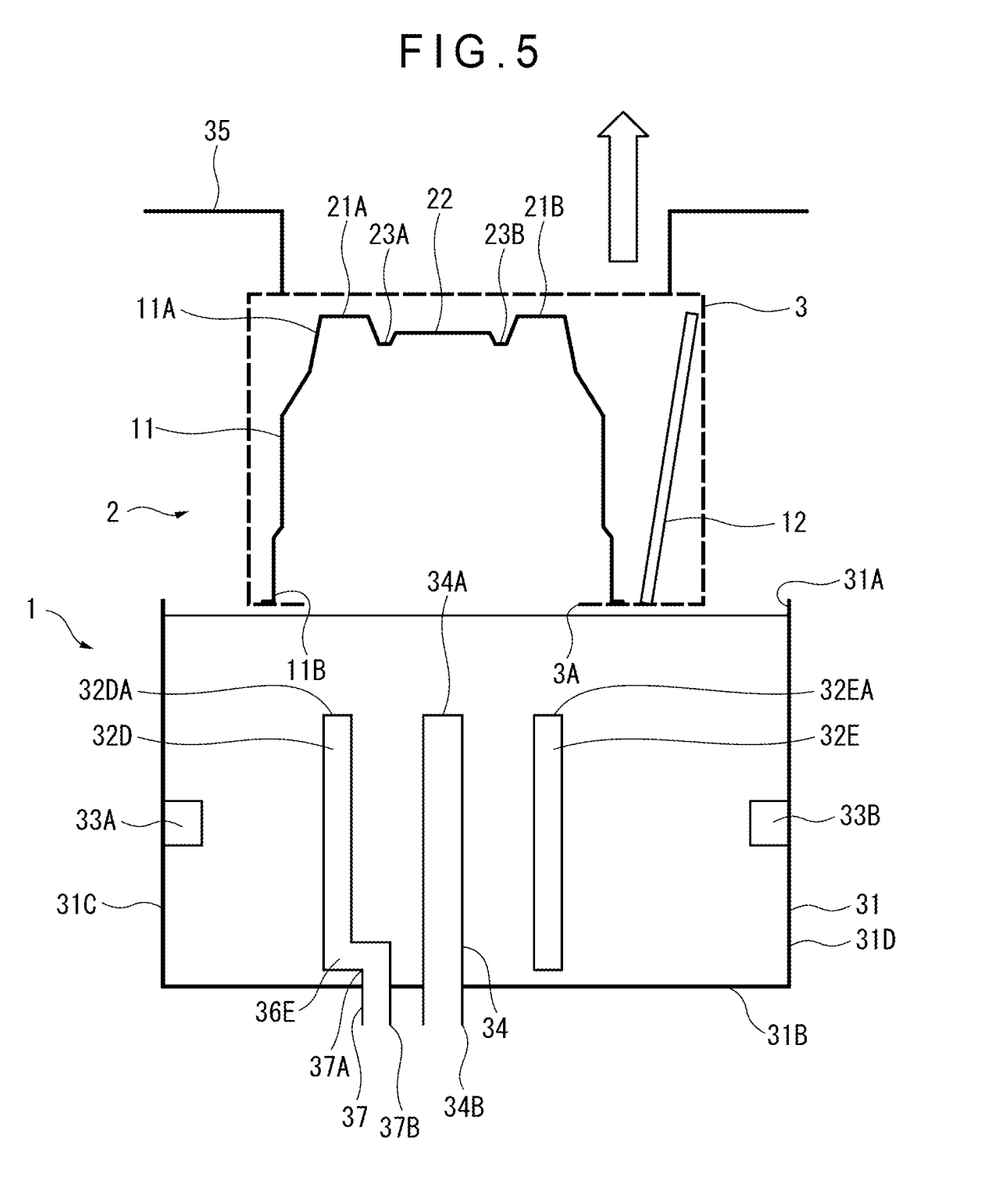
FIG. 5 is a schematic front elevational cross-sectional view depicting the housing jig housing the wafer container, which is pulled up from the wafer container cleaner.

As depicted in FIGS. 1, 5, and 6, the immersion-takeout movement mechanism 35 is configured to move the housing jig 3 housing the container body 11 and the cover 12 to an immersed state for the housing jig 3 to be immersed in the cleaning liquid or the cleaning water in the cleaning bath 31 and to a pulled-up state for the housing jig 3 to be pulled up out of the cleaning liquid or the cleaning water from the immersed state. The immersion-takeout movement mechanism 35 is depicted as a pair of bent components in FIGS. 1, 5, and 6. However, the actual immersion-takeout movement mechanism 35 is provided by a robot that is provided with a holder for holding an upper side of the housing jig 3 and is configured to move the housing jig 3 to the immersed state and the pulled-up state and to transfer the housing jig 3 to other location(s).

Cleaning Method of Wafer Container

Next, a cleaning method of the wafer container 2 with a use of the wafer container cleaner 1 constructed as described above will be described below with reference to FIGS. 1, 5, and 6.

Initially, using the immersion-takeout movement mechanism 35, the housing jig 3, which houses the container body 11 and the cover 12 with the container opening 11B facing downward, is immersed in the cleaning bath 31 filled with the cleaning liquid as depicted in FIG. 1 (immersion step).

Subsequently, the liquid-supply pump (not depicted) is driven to supply the cleaning liquid to the liquid-supply nozzles 32A to 32H through the liquid-supply pipe 37 and the connector pipes 36A to 36E to discharge the cleaning liquid through the liquid-supply openings 32AA to 32HA, and, simultaneously, to supply the cleaning liquid to the side liquid-supply nozzles 33A and 33B to discharge the cleaning liquid toward the center of the cleaning bath 31, so that the cleaning liquid overflows from the bath opening 31A of the cleaning bath 31. Further, the liquid-discharge pump (not depicted) is driven to suck in the to-be-discharged fluid through the discharge opening 34A of the liquid-discharge nozzle 34 to discharge the to-be-discharged fluid out of the cleaning bath 31.

By driving the liquid-supply pump and the liquid-discharge pump as described above, flows of the cleaning liquid and the to-be-discharged fluid are caused as depicted by arrows in FIG. 1.

As the immersion-takeout movement mechanism 35 immerses the housing jig 3 into the cleaning liquid toward the bath bottom 31B of the cleaning bath 31, the air in the container body 11, which is sucked in through the liquid-discharge nozzle 34 together with the to-be-discharged fluid, is gradually discharged from the inside of the container body 11.

It should be noted that, when the housing jig 3 eventually reaches the bath bottom 31B, the air possibly remains in the peripheral cavities 21A and 21B and the central cavity 22 of the container body 11.

However, in the accommodating state depicted in FIG. 1, the liquid-supply openings 32AA to 32HA of the liquid-supply nozzles 32A to 32H are provided to be close to the inner side of the depth wall 11A of the container body 11 and the discharge opening 34A of the liquid-discharge nozzle 34 is provided to be close to the center of the inner side of the depth wall 11A. In this state, the cleaning liquid is supplied toward the inner side of the depth wall 11A and the to-be-discharged fluid is discharged from a region near the center of the inner side of the depth wall 11A.

The above-described arrangement and operation allow the air remaining in the peripheral cavities 21A and 21B and the central cavity 22 to be displaced and concentrated at the region near the center of the inner side of the depth wall 11A. The remaining air is thus discharged through the discharge opening 34A together with the to-be-discharged fluid out of the container body 11. Accordingly, the cleaning liquid can reach the peripheral cavities 21A and 21B and the central cavity 22, so that the interior of the container body 11 can be sufficiently cleaned. In the exemplary embodiment, the plurality of liquid-supply nozzles 32A to 32H are located to surround the liquid-discharge nozzle 34. Accordingly, air that is likely to be left at the depth wall 11A of the container body 11 can be efficiently discharged.

The outer wall of the container body 11 and the cover 12 are cleaned by the cleaning liquid discharged through the side liquid-supply nozzles 33A and 33B toward the center of the cleaning bath 31. At this time, since the housing jig 3 is configured to allow fluid circulation therethrough, the cleaning liquid, whose power is hardly reduced by the housing jig 3, reaches the outer wall of the container body 11 and the cover 12, so that the outer wall of the container body 11 and the cover 12 can be sufficiently cleaned.

In the immersion step, a supply flow rate for supplying the cleaning liquid into the container body 11 is set larger than a discharge flow rate for discharging the cleaning liquid out of the container body 11. The cleaning liquid thus overflows from the container opening 11B as depicted in FIG. 1 after the cleaning liquid reaches all parts of the container body 11. Accordingly, circulation efficiency of the cleaning liquid in the container body 11 is improved as compared with an instance for discharging the cleaning liquid only through the liquid-discharge nozzle 34, thereby further improving the cleanability of the wafer container 2.

Subsequently, the immersion-takeout movement mechanism 35 causes at least one reciprocating movement of the housing jig 3 housing the container body 11 and the cover 12 between the pulled-up state (see FIG. 5) (i.e. a state where the housing jig 3 is pulled up out of the cleaning liquid from the immersed state where the housing jig 3 is immersed in the cleaning liquid in the cleaning bath 31 depicted in FIG. 1) and the immersed state (see FIG. 6) (i.e. a state where the housing jig 3 is immersed in the cleaning liquid in the cleaning bath 31) (immersion-pull-up movement step). In the immersion-pull-up movement step, the number of the reciprocating movements is preferably in a range from 1 to 5, more preferably approximately 3. The cleaning effect is small without the reciprocating movement. In contrast, work efficiency is lowered with 6 or more reciprocating movements.

The cleaning liquid, whose flow on the surface of the cover 12 is caused by the immersion-pull-up movement step, can reach minute parts and hollows of the latch mechanisms 24, front retainer 25, and the like depicted in FIG. 10A, so that sufficient cleaning can be performed. In addition, remaining contamination (e.g. particles) on the container body 11 and the cover 12 can be reduced. Accordingly, the cleanability of the wafer container 2 can be improved.

A movement speed of the housing jig 3 between the pulled-up state and the immersed state is preferably determined so that the work efficiency can be improved without causing residual liquid on the container body 11 and the cover 12.

After cleaning the wafer container 2 with the use of the cleaning liquid as described above, the immersion-takeout movement mechanism 35 moves the housing jig 3 housing the wafer container 2 to the wafer container cleaner 1 provided with the cleaning bath 31 filled with cleaning water (e.g. pure water), where the immersion step and the immersion-pull-up movement step are performed.

When the wafer container 2 is cleaned with the use of the cleaning water, the cleaning liquid can be more efficiently washed out than a typical arrangement, by supplying the cleaning water to the peripheral cavities 21A and 21B, discharging the liquid from a region near the central cavity 22, overflowing the cleaning water from the container opening 11B, and improving the cleaning effect by the immersion-pull-up movement step as described above in the operation using the cleaning liquid. Consequently, the cleaning liquid is more unlikely to remain on the container body 11 and the cover 12. Accordingly, deterioration with age and appearance defects are unlikely to be caused on the container body 11 and the cover 12.

Modifications

It should be noted that the specific arrangement of the invention, which is not limited by the exemplary embodiments of the invention described in detail with reference to the attached drawings, encompasses improvements, design modifications and the like as long as such improvements, modifications and the like are compatible with an object of the invention.

For instance, the liquid-supply nozzles 32A to 32H and the liquid-discharge nozzle 34, which are fixed in the exemplary embodiment, are not necessarily configured as described in the exemplary embodiment. Specifically, the liquid-supply nozzle(s) 32 and the liquid-discharge nozzle 34 are optionally configured to be exchangeable with corresponding components of different lengths or capable of slightly moving up and down depending on the shape of the container body 11. In this case, by arranging the liquid-supply nozzles 32A to 32H and the liquid-discharge nozzle 34 so that the height of the liquid-discharge nozzle 34 is equal to or different from the height of each or one or more of the liquid-supply nozzles 32A to 32H or the heights thereof are adjustable depending on the shape of the depth wall of the container body 11, the liquid-supply nozzles 32A to 32H and the liquid-discharge nozzle 34 can be adapted to a plurality of types of wafer containers 2 with different shapes (e.g. without the peripheral cavities 21A and 21B and/or the central cavity 22 on the depth wall 11A).

A fluid introduction unit (e.g. projection(s)) is optionally provided at an end of each of the liquid-supply nozzles 32A to 32H. The distance between the liquid-supply openings 32AA to 32HA and the depth wall 11A in the accommodating state can be defined by the height of the fluid introduction unit to be in contact with the depth wall 11A. The distance between the depth wall 11A of the container body 11 and the liquid-discharge opening 34A in the accommodating state is, though being different depending on the type of the container body 11 and/or the shape of the depth wall 11A, for instance, preferably 50 mm or less. With the above distance being 50 mm or less, the to-be-discharged fluid and air can be sufficiently sucked in from various parts of the depth wall 11A.

Figure 7A:
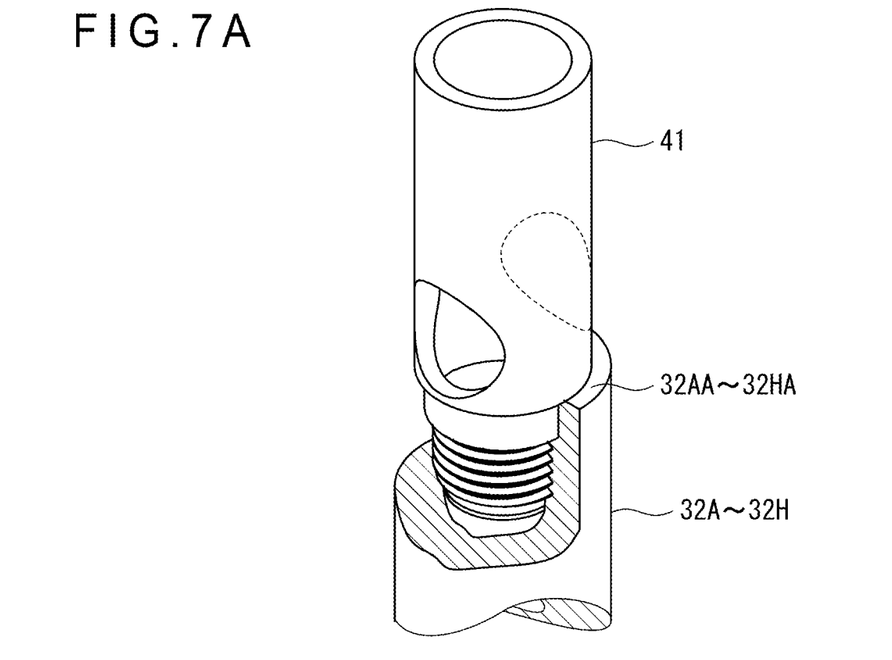
FIG. 7A, which illustrates a modification of the invention, is a partially sectioned perspective view illustrating an example of a liquid-supply nozzle attached with an in-liquid ejection nozzle at an end thereof.

Alternatively, as illustrated in FIG. 7A, a metal or resin-made in-liquid ejection nozzle 41 is optionally attached to an end of each of the liquid-supply nozzles 32A to 32H. The in-liquid ejection nozzle 41, from which fluid is ejected in the liquid, sucks in the cleaning liquid or cleaning water near the in-liquid ejection nozzle using the negative pressure caused by the ejected fluid, thereby ejecting the cleaning liquid or cleaning water at a flow rate three to four times larger than the supply flow rate of the liquid-supply pump. With the in-liquid ejection nozzle 41, the circulation efficiency of the cleaning liquid or cleaning water is improvable.

Figure 7B:
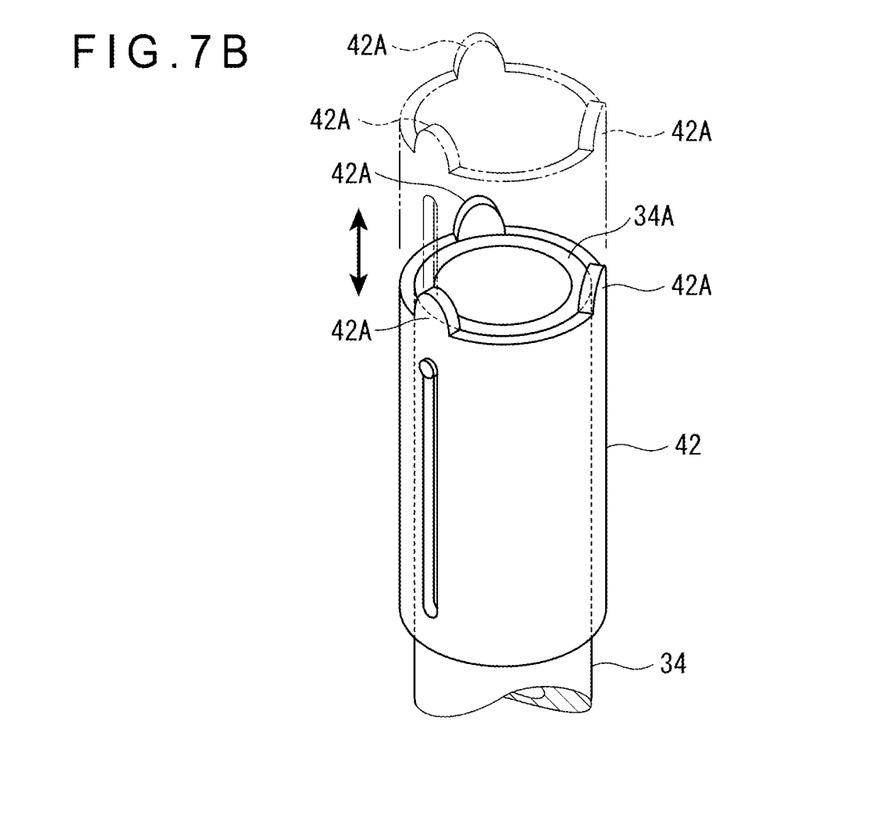
FIG. 7B, which illustrates a modification of the invention, is a perspective view illustrating an example of a liquid-discharge nozzle attached with a float at an end thereof.

As illustrated in FIG. 7B, a cylindrical float 42, which has fluid introduction units 42A (e.g. projection(s)), is optionally loosely fitted to an end of the liquid-discharge nozzle 34. The float 42, which rises by buoyant force in the cleaning liquid or cleaning water to bring the fluid introduction units 42A into contact with the depth wall 11A, creates a space between the depth wall 11A and the discharge opening 34A to allow the to-be-discharged fluid and air to be vigorously sucked in. The float 42, which is not necessarily provided, can improve the circulation efficiency of the cleaning liquid or the cleaning water once provided. In addition, the float 42 allows the to-be-discharged fluid to be constantly sucked in from a region near the depth wall 11A irrespective of an immersion depth of the wafer container 2.

The eight liquid-supply nozzles 32A to 32H, the two side liquid-supply nozzles 33A and 33B, and the single liquid-discharge nozzle 34 are exemplarily arranged as depicted in FIG. 2 in the exemplary embodiment. However, the number and location of the liquid-supply nozzle(s) 32, the side liquid-supply nozzle(s) 33, and the liquid-discharge nozzle (s) 34 are not limited to those of the exemplary embodiment. For instance, in place of or in addition to the side liquid-supply nozzles 33A and 33B, a side liquid-supply nozzle 33 is optionally provided substantially at the center of an inner side of each of the side walls 31E and 31F (vertically facing with each other in FIG. 2) of the cleaning bath 31.

The supply flow rate for supplying the cleaning liquid or cleaning water into the container body 11, which is exemplarily set larger than the discharge flow rate for discharging the cleaning liquid or cleaning water out of the container body 11 through the liquid-discharge nozzle 34 in the exemplary embodiment, is not necessarily larger than the discharge flow rate. However, the supply flow rate larger than the discharge flow rate can achieve the above-described advantages.

Further, the housing jig 3, which is constructed by assembling resin-made pipes into a rectangular parallelepiped whose sides are defined by coarse grids in the exemplary embodiment, is not necessarily configured as described in the exemplary embodiment. The housing jig 3 is optionally in any form (e.g. assembling wire materials into a rectangular parallelepiped whose sides are defined by coarse grids) capable of housing the wafer container 2 and allowing the fluid circulation therethrough.

The immersion-takeout movement mechanism 35, which is configured to perform the transfer step for transferring the housing jig 3 to another location in addition to the immersion step and the immersion-pull-up movement step in the exemplary embodiment, is not necessarily configured as described in the exemplary embodiment. For instance, the immersion-takeout movement mechanism 35 is optionally dedicated to perform the immersion step and the immersion-pull-up movement step, where the transfer step of the housing jig 3 is performed by some other component(s).

EXAMPLES

Next, Examples of the invention will be described below. It should be noted that the scope of the invention is by no means limited to these Examples.

In Example 1, the immersion step was solely performed with the use of the wafer container cleaner 1 according to the exemplary embodiment. In Example 2, the immersion step and the immersion-pull-up movement step were performed with the use of the wafer container cleaner 1. In contrast, a shower method was employed in Comparative 1. Subsequently, after the cleaned container body 11 was filled with pure water, an average number of particles having a particle diameter of 0.1 μm or more that were present per 0.1 ml pure water was measured in all of Examples 1 and 2 and Comparative 1.

The used wafer container was FOSB (Front Opening Shipping Box) manufactured by Miraial Co., Ltd. used for transporting and shipping wafers in all of Examples 1 and 2 and Comparative 1. The particles in the liquid were measured with a use of a particle sensor KS-40A manufactured by RION Co., Ltd.

Figure 8:
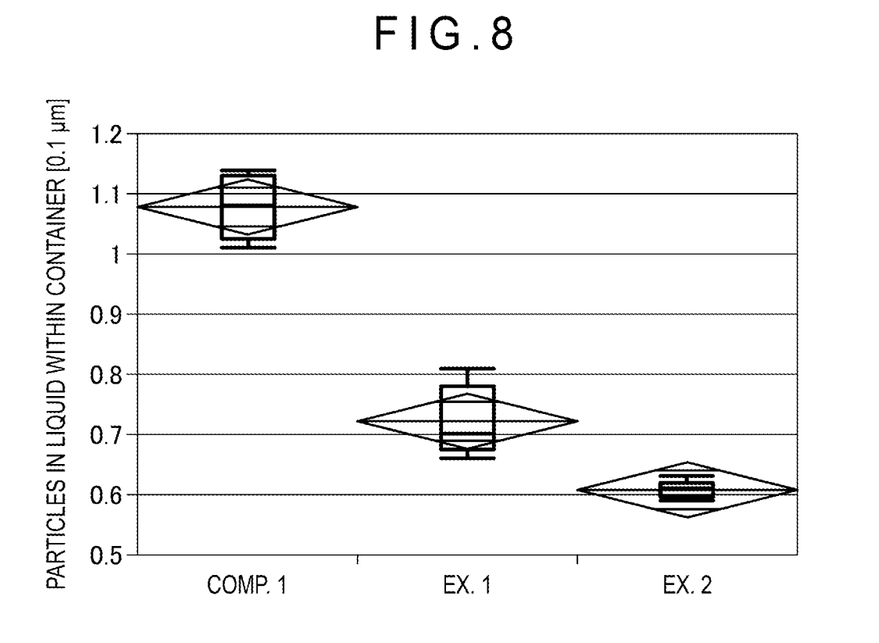
FIG. 8 is a graph showing results of measuring an average number of particles having a particle diameter of 0.1 μm or more that are present in 0.1 ml pure water in the container body cleaned by cleaning methods according to Examples and Comparative.

Table 1 and FIG. 8 show examples of results of measuring, after filling the container body cleaned according to Examples 1 and 2 and Comparative 1 with pure water, the average number of particles having a particle diameter of 0.1 μm or more that were present in the 0.1 ml pure water.

TABLE 1

| | Cleaning Method | Immersion-Pull-Up | Particles in Liquid within Container [0.1 μm] |
|---|---|---|---|
| Comp. 1 | shower | — | 1.08 |
| Ex. 1 | immersion | No | 0.72 |
| Ex. 2 | immersion | Yes | 0.61 |

EVALUATION

In Comparative 1 using the shower method, the average number of the particles having a particle diameter of 0.1 μm or more was 1.08, which shows low cleaning performance. In contrast, according to Example 1 using the immersion method, the average number of the particles was 0.72, which shows improved cleaning performance as compared with Comparative 1. In Example 2, the average number of the particles was reduced to 0.61, which shows significantly improved cleaning performance.

The invention claimed is:

1. A wafer container cleaner configured to clean a wafer container comprising a container body configured to store a plurality of wafers and a cover configured to close a container opening of the container body, the wafer container being housed in a housing jig that allows fluid circulation therethrough, the wafer container cleaner comprising:
    a cleaning bath configured to accommodate the housing jig housing the wafer container;
    a plurality of liquid-supply nozzles configured to supply cleaning liquid or cleaning water into the cleaning bath;
    a liquid-discharge nozzle configured to discharge to-be-discharged fluid out of the cleaning bath; and
    an immersion-takeout movement mechanism comprising a robot configured to cause at least one reciprocating movement of the housing jig between an immersed state for the housing jig to be immersed in the cleaning liquid or the cleaning water in the cleaning bath and to a pulled-up state for the housing jig to be pulled up out of the cleaning liquid or the cleaning water from the immersed state, wherein
    the container body comprises a depth wall at a side opposite the container opening,
    at least one of the plurality of liquid-supply nozzles comprises a liquid-supply opening through which the cleaning liquid or the cleaning water is discharged, the at least one liquid-supply nozzle being provided so that the liquid-supply opening faces upward at a position facing an inner side of the depth wall in an accommodating state where the container body mounted on the housing jig with the container opening facing downward is accommodated in the cleaning bath,
    the liquid-discharge nozzle comprises a discharge opening through which the to-be-discharged fluid is sucked in, the liquid-discharge nozzle being provided so that the discharge opening faces upward at a position facing a center of the inner side of the depth wall in the accommodating state, and
    a height position of the liquid-supply opening that faces upward at the position facing the inner side of the depth wall is substantially equal to a height position of the discharge opening.

2. The wafer container cleaner according to claim 1, wherein
    a supply flow rate for supplying the cleaning liquid or the cleaning water into the container body is set larger than a discharge flow rate for discharging the cleaning liquid or the cleaning water from an inside of the container body through the liquid-discharge nozzle.

3. A method for cleaning a wafer container comprising a container body configured to store a plurality of wafers and a cover configured to close a container opening of the container body, the wafer container being housed in a housing jig that allows fluid circulation therethrough, the container body comprising a depth wall at a side opposite the container opening, the method comprising:

immersing the housing jig housing the wafer container with the container opening of the container body facing downward in a cleaning bath filled with cleaning liquid or cleaning water;

in an immersed state of the wafer container, supplying the cleaning liquid or the cleaning water toward an inner side of the depth wall from at least one of a plurality of liquid-supply nozzles and discharging to-be-discharged fluid of a region near a center of the inner side of the depth wall from a liquid-discharge nozzle, the at least one liquid-supply nozzle comprising a liquid-supply opening through which the cleaning liquid or the cleaning water is discharged, the at least one liquid-supply nozzle being provided so that the liquid-supply opening faces upward at a position facing the inner side of the depth wall, the liquid-discharge nozzle comprising a discharge opening through which the to-be-discharged fluid is sucked in, the liquid-discharge nozzle being provided so that the discharge opening faces upward at a position facing the center of the inner side of the depth wall; and causing at least one reciprocating movement of the housing jig between the immersed state and a pulled-up state for the housing jig to be pulled up out of the cleaning liquid or the cleaning water from the immersed state, wherein a height position of the liquid-supply opening is substantially equal to a height position of the discharge opening.

4. The method for cleaning the wafer container according to claim 3, wherein in the immersing the housing jig, a supply flow rate for supplying the cleaning liquid or the cleaning water into the container body is set larger than a discharge flow rate for discharging the cleaning liquid or the cleaning water from an inside of the container body.

\* \* \* \* \*